United States Patent [19]

Lerner et al.

[11] 4,033,835

[45] July 5, 1977

[54] TIN-NICKEL PLATING BATH

[75] Inventors: Lewis Brian Lerner, Linglestown; Thomas Francis Davis, Harrisburg, both of Pa.

[73] Assignee: AMP Incorporated, Harrisburg, Pa.

[22] Filed: Oct. 14, 1975

[21] Appl. No.: 621,997

[52] U.S. Cl. .............................. 204/43 S; 204/43 T; 204/43 P
[51] Int. Cl.² ....................... C25D 3/56; C25D 3/60
[58] Field of Search ............. 204/43 S, 43 T, 43 P, 204/123

[56] References Cited

UNITED STATES PATENTS

| | | | |
|---|---|---|---|
| 1,564,414 | 12/1925 | Hoff | 204/50 Y |
| 3,887,444 | 6/1975 | Fueki et al. | 204/43 S |

*Primary Examiner*—G. L. Kaplan
*Attorney, Agent, or Firm*—Gerald K. Kita

[57] ABSTRACT

A method and electrolyte for electrodepositing a corrosion — resistant, soft and ductile tin — nickel alloy. A typical electrolyte is an aqueous solution of tin salts, nickel salts, thiourea, sodium hypophosphite, hydrochloric acid, and ammonium chloride and has a pH of 0.7 to 1.5.

9 Claims, No Drawings

TIN-NICKEL PLATING BATH

This invention relates to a method for electroplating an alloy or intermetallic deposit of tin and nickel; more specifically, this invention relates to a method for an electrolytic deposition of a consistent alloy or alloy compositions of various proportions over a large current density range, a wide temperature range, and a wide range of solution component proportions. A salt composition suitable for dilution in an aqueous acidic solution acid used for making up baths for electroplating these intermetallics is also within the contemplation of this invention.

A number of benefits arise from the use of the deposit from a novel bath composition such as corrosion resistance, improved softness, improved ductility, less stressed deposits, etc. in addition to the ability to use the electrolyzed bath in a high speed stripline plating at high current densities. Other benefits such as simplified waste treatment of the bath effluent, a more true nickel color of the deposit, greater deposit thickness, lower metal concentration in bath, etc. have also been noted.

BACKGROUND OF THE INVENTION

Various bright tin-nickel alloy plating electrolytes have been proposed in the past which comprise a stannous salt and nickel salt and various other additives which are used for solubilizing and/or complexing the metal salts. In addition, various brightness have been added to the plating liquid such as an amine moiety containing compounds as well as other. Illustrative bath components are disclosed in patents such as U.S. Pat. No. 3,753,873 and U.S. Pat. No. 3,887,444. The last patent discloses nickel-tin alloys plated from alkaline medium containing cyanides which pose a great number of problems with respect to toxicity and effluent treatment. The above-mentioned patents disclose alkaline bath because, as it is well known, cyanide baths cannot be used with an acidic medium.

A tin-cobalt alloy plating from a pyrophosphate bath has been disclosed in Bull. India Sect., Electrochem. Soc., Vol. 9, pp. 13 to 14 (1960). However, the bath does not provide consistent deposits and the preferrential plating of one of the other metals renders the bath undesirable. Moreover, powdery deposits often occur when using pyrophosphate baths of prior art. As a possible composition, a ternary alloy containing tin and nickel with a balance being cobalt is disclosed in the above literature reference.

In general, the prior art bath used for depositing tin-nickel alloys have used fluoride based electrolytes which again pose many problems associated with waste or effluent treatment. Illustrative patents in this group are U.S. Pat. Nos. 3,141,836 and 3,682,604.

While a number of other, non-electrolytic methods are known for depositing tin, such as by electroless or replacement coating for tin, illustrated in U.S. Pat. No. 3,303,029 for nickel such as shown in U.S. Pat. No. 3,265,511, in general, the prior art methods associated with electroless or immersion plating suffer from a number of disadvantages especially because of the failure to obtain proper codeposits of alloys.

While some methods have lately been disclosed in the electroless deposition field, the necessity to improve the electroplating of tin-nickel alloys has become manifestly evident because of the advantages that a good electroplating method provides.

In plating a suitable substrate material to protect it from corrosion, the deposits should be thick enough to be virtually nonporous and thus a good throwing or leveling power of a tin-nickel plate is fairly important. The previously mentioned fluoride bath provides highly stressed hard deposits (750 Knoop units 25 grams) and thus deposits of over 75 microinches are not possible.

While the leveling or throwing power has often been achieved by additives including a great number of amine base additives, the presently discovered combination of elements achieves the same result with fewer elements in a different combination. Moreover, the deposit according to the present invention is ductile, i.e., will not exfoliate in thickness up to 1 mil or over and is softer (400 – 450 Knoop value – 25 gr.) as well as is without the undesirable pink cast. Inasmuch as the tin-nickel intermetallics are very useful in the electronic industry as substrate for gold and the corrosion resistance for contacts which are overplated with gold, the present deposits need only e. g. 5 $\mu$ inches gold whereas prior art nickel underplate requires 30 $\mu$ inches to achieve equivalent corrosion resistance. The present electrolyte makes it manifestly evident the advantages which can be gathered from a properly coacting element in an electrolytic bath.

Still further, in stripline plating, that is, where a continuous plating on a continuously moving strip is being deposited in a limited area of the substrate such as copper or bronze, nickel-iron; copper-nickel-tin; ferrous or nonferrous materials or other suitable metals, the plating speeds have been achieved which are not normally achieved by rack or barrel plating methods. These speeds are as a result of the high transfer of the plating solution to the area being plated and the removal of the depleted plating solution such as by belts or discs or spiral contact surfaces moving at a rate different from a moving stripline. High current densities are practical such as of densities up to 300 ASF.

Prior art fluoride baths appear to require a current density range of 20 to 30 ASF and any deviation from it results in an alloy deposit of varying proportions of pure tin and nickel. The deposits obtained when using the present bath solution in stripline plating are highly corrosion resistant and are of good quality.

As another advantage over the prior art baths, such as the fluoride solution containing baths, is the considerably simplified waste treatment of the present bath solution without the increasingly stricter fluoride waste treatment requirements which are now required and which require rather elaborate processing steps. For example, in some states the amount of fluoride in the effluent cannot exceed 1 part per million.

Hence, the present bath composition has provided an alternate bath which possesses all of the listed advantages of the prior art baths and also provides simplified waste treatment. The presently discovered bath compositions and the effluents therefrom are readily treated in a simplified manner for meeting the pollution requirements and the effluent dischange is substantially nontoxic.

DESCRIPTION OF THE INVENTION AND THE EMBODIMENTS THEREOF

As mentioned above, the present invention is directed to a method for electroplating, a bath, as well as a salt composition suitable for use in forming an electrolytic bath upon dilution with acidified water. The method for electroplating which has been discovered not only provides for a consistent alloy plating over large current densities, temperature ranges, and solution component compositions, but also provides softer and more ductile platings of thicknesses which heretofore could not be achieved, with a color cast of highly desirable quality, of improved corrosion resistance (nitric acid or sulfur dioxide test).

A specific, consistent alloy composition such as 67 percent tin and 33 percent nickel over large current density, for example, 5 to 250 ASF has been provided. A wide temperature range and solution component composition range provides for the deposition of the consistent alloy, hence, the bath also forms part of this invention as well as the solid salt composition thereof.

The discovered method provides excellent ductility, e. g., a 1.3 mil deposit on a piece of tin foil can be bent 180°, can be bent back and there is no exfoliation. The softer deposits of the tin-nickel intermetallics or the alloy compositions which, as mentioned before, are highly corrosion resistant as well as wear resistant provide the deposits of high desirable characteristics.

Although a particularly useful method for depositing these alloys has been found to be a high speed stripline plating method such as the well known belt or other equivalent methods which are well known in the art, the conventional plating methods have also been improved by the use of the electrolyte bath which has been discovered. Thus, conventional rack and barrel plating methods have also been improved.

For obtaining intermetallic compositions of about 67 percent tin to 33 percent nickel, the bath composition comprises, nickel such as a soluble salt thereof, e. g., nickel chloride, nickel sulfate, etc., and based on the metal in an amount from 7.5 to 30 grams per liter of the bath solution; tin such as in the form of stannous tin soluble salts, e.g., tin chloride ($SnCl_2 \cdot H_2O$), tin bromide, or tin sulfate based on tin metal in an amount from 7.5 to 30 grams per liter; as a complexing agent for the tin metal, thiourea in an amount from 10 to 80 grams per liter; but preferably 20 grams per liter thiourea is used for each 7.5 grams of tin as metal; sodium hypophosphite ($NaH_2PO_2 \cdot H_2O$) in an amount from 10 to 80 grams per liter, but more preferably 20 grams per liter for each 7.5 grams of tin as metal on hydrated basis, hydrochloric acid (HCl) in an amount from 30 to 100 milliliters per liter (minimum is 30 milliliters of acid as electrolyte solubilizng agent, and to prevent tin from oxidizing or hydrolyzing) on basis of 36 – 38 percent concentration HCl, for solubility, and ammonium chloride ($NH_4Cl$) in an amount from 40 to 200 grams per liter. Ammonium chloride is preferred as in thiourea break down, $NH_4Cl$ is useful as a stabilizer electrolyte. KCl and NaCl could be used in place of $NH_4Cl$ but $NH_4CL$ is preferrable for the above reason.

A more specific bath composition which has been found to be useful for the obtention of the consistent alloys of $SnNi_2$ was found to be as follows:

| 7.5 | grams/liter | Sn ° |
| 7.5 | grams/liter | Ni ° |
| 10 | grams/liter | Thiourea |
| 20 | grams/liter | $NaH_2PO_2 \cdot H_2O$ |
| 200 | grams/liter | $NH_4Cl$ |
| 50 | milliliters | HCl |
| 200 | ppm | Na-Lauryl Sulfate |

Current density is in excess of 80 ASF.

The operating temperature is within 100° to 170° whereas a practical temperature range for keeping all salts safely in solution is from 130° to 160° F; current density is from 5 ASF as a minimum to up to 250 ASF, but a practical range is 60 to 150 ASF. With respect to the first disclosed bath composition, the hardness of the deposit at 25 grams is from 350 to 450 Knoop units, the deposits are semibright as plated. The pH of the above baths is generally from 0.7 to 1.5.

Another bath composition contains nickel in an amount from 7.5 to 30 grams per liter and added as nickel chloride on the basis of nickel as elemental metal, tin (as $SnCl_2 \cdot H_2O$) in an amount from 15 to 45 grams per liter; thiourea, 20 grams for each 7.5 grams of tin metal; sodium hypophosphite, 20 grams for each 7.5 grams of tin metal, and wherein it is added as dihydrate thereof; hydrochloric acid in an amount from 30 to 60 milliliters per liter at a concentration of 36 percent, ammonium chloride in an amount from 150 to 200 grams per liter, and sodium lauryl sulfate in an amount from 0.05 to 0.3 grams per liter. An operating temperature for said bath is from 120° to 160° F and the pH of the bath is from 0.7 to 1.5.

As it is obvious from the above disclosure, the compounding of the solid composition is readily carried out and the acidified water such as water acidified by hydrochloric acid in the amounts given for the bath composition can be added at a later time either for a start-up bath or for purposes of supplementing an existing bath to replenish the depleted or dragged out components.

Accordingly, the present invention also contemplates the storage stable solids, as salt compositions for use of making a bath composition. These compositions are usefully packaged in sealed containers.

As it has been discussed previously, a high speed stripline plating is a highly agitated plating but normal mechanical agitation for rack and barrel plating is also suggested.

As it is evident from herein, current density can range from a minimum of 5 ASF to up to 300 ASF.

Normal anodes for tin nickel are used in the above operation.

As it is evident from the above, because the bath is basically a hydrochloric acid acidified aqueous solution, the nickel salts ae preferrably in the form of the chlorides or halogenides. Similarly, tin is in the form of tin chloride or halogenides.

As a complexing agent for tin, thiourea has been found to be exceptionally useful, but other thiourea derivatives are useful such as dimethyl or tetramethyl thiourea; these are used in an amount of 10 to 100 grams per liter of bath solution.

As a suitable hypophosphite, sodium hypophosphite is emminently advantageous, however, ammonium hypophosphite and potassium hypophosphite can be used; there are used in an amount from 10 to 100 grams per liter of bath solution.

Although sodium lauryl sulfate is a suggested wetting agent, other and similar long chain alkyl sulfate salts are equally suitable; further, as wetting agents, any bath soluble wetting agent is useable, such as Igepal — CO-970 reputedly a nonylphenoxy-ethylene oxides adduct and available from G.A.F., Inc.

Solderability of the deposit is also equally acceptable if soldering is carried out immediately, but after aging the deposit must be activated such as by HCl pickling.

With respect to the following examples, the illustrative process conditions as well as the plating conditions are shown for the intermetallics merely to illustrate the invention and not to limit the same.

EXAMPLE 1

A tin-nickel plating of 67 percent tin to 33 percent nickel, by weight, were obtained from the following bath:

| | |
|---|---|
| 3 oz/gal | Sn ° (added as SnCl$_2$. 2H$_2$O) |
| 2 oz/gal | Ni ° (added as NiCl$_2$. 7H$_2$O) |
| 50 grams/liter | Thiourea |
| 50 grams/liter | NaH$_2$PO$_2$. H$_2$O |
| 50 ml/l | HCl |
| 100 g/l | NH$_4$Cl |
| 200 ppm | Na Lauryl sulfate |
| Operating Temperature - 65° C | |
| Current Density - 40 ASF | |
| Mechanical Agitation | |
| Insoluble platinum anodes or Nickel Anodes | |
| (Must be pulled when not in use) | |

The electrolyzed solution plates a true intermetallic that is highly corrosion resistant. No attack on the deposited material in either nitric acid fumes, or on the substrate by 1 percent SO$_2$ is evidenced. The composition is 67 percent Sn-33 percent Ni, and maintains this ratio extremely well to over to 100 ASF. Hull cell panels plated in this system remain bright to over 200 ASF. This bath also precipitates solids at room temperature, gentle heating will solubilize the precipitate.

EXAMPLE 2

The following bath composition was found to plate 50 percent Sn to 50 percent nickel (SnNi$_2$) intermetallic by weight.

| | | |
|---|---|---|
| 7.5 | grams/liter | Sn° |
| 7.5 | grams/liter | Ni° |
| 10 | grams/liter | Thiourea |
| 20 | grams/liter | NaH$_2$PO$_2$. H$_2$O |
| 200 | grams/liter | NH$_4$Cl |
| 50 | ml/l | HCl |
| 200 | ppm | Na Lauryl sulfate |

Current density is in excess of 80 ASF. Other operating conditions are as in Example 1.

Because of the relatively low metal concentration in the bath solution (when compared to prior art), the metal loss from "drag out" from the bath is lower and thus less metal is lost. Also, for the above-intermetallic a low thiourea content provides for the alternation of the deposit constitution.

The above bath solutions have been used to plate printed circuit boards, phosphor-bronze terminals, brass terminal with copper-nickel underplate, etc.

What is claimed is:

1. A method for depositing tin-nickel alloys from an aqueous electrolyte solution comprising electrolyzing said solution which contains nickel, as metal, in the amount from 7.5 to 30 grams per liter as a soluble nickel salt, tin from 7.5 to 30 grams per liter as a soluble tin, salt a thiourea in the amount from 10 to 100 grams per liter, sodium, ammonium or potassium hypophosphite in an amount from 10 to 100 grams per liter, hydrochloric acid from 30 to 100 millimeters per liter based on a concentration of 36 percent to 38 percent and ammonium, sodium, or potassium chloride from 40 to 200 grams per liter, said solution being at a pH from 0.7 to 1.5 and at a temperature from 100° to 170° F, depositing said tin-nickel alloy on a work piece, and recovering said work piece with the alloy deposited thereon.

2. The method as defined in claim 1 wherein the operating temperature is from 130° to 160° F.

3. The method as defined in claim 1 wherein the bath also contains a wetting agent.

4. The method as defined in claim 3 wherein a sodium alkyl sulfate is added as a wetting agent.

5. The method as defined in claim 1 wherein ammonium or potassium hypophosphite is used.

6. The method as defined in claim 1 wherein the nickel salt is nickel chloride, tin salt is tin chloride or tin bromide, a thiourea is thiourea, the hypophosphite is sodium hypophosphite, and as chloride, ammonium chloride is used.

7. The method as defined in claim 1 wherein the electrolyzed solution is electrolyzed at a current density of from 5 ASF up to 300 ASF.

8. An aqueous electrolyte suitable for electrodeposition of tin-nickel alloys from said electrolyte, said aqueous electrolyte comprising nickel as nickel chloride, based on the metal, in an amount from 7.5 to 30 grams per liter, tin as tin chloride (SnCl$_2$·H$_2$O) based on the metal from 7.5 to 30 grams per liter, thiourea from 10 to 100 grams per liter, sodium hypophosphite from 10 to 100 grams per liter, hydrochloric acid from 30 to 100 milliliters per liter as a concentrated acid of 36 percent to 38 percent acid and ammonium chloride an amount from 40 to 200 grams per liter and wherein the pH of said solution is from 0.7 up to 1.5.

9. The bath composition as defined in claim 8 wherein nickel is in an amount from 7.5 to 30 grams per liter and added as nickel chloride on the basis of nickel as elemental metal, tin (as SnCl$_2$·H$_2$O) in an amount from 15 to 45 grams per liter; thiourea, 20 grams for each 7.5 grams of tin metal; sodium hypophosphite, 20 grams for each 7.5 grams of tin metal, and wherein it is added as dihydrate thereof; hydrochloric acid in an amount from 30 to 60 milliliters per liter at a concentration of 36 percent, ammonium chloride in an amount from 150 to 200 grams per liter, and sodium lauryl sulfate in an amount from 0.05 to 0.3 grams per liter, wherein the operating temperature of said bath is from 120° to 160° F and the pH of the bath is from 0.7 to 1.5.

* * * * *